(12) United States Patent
Khlat et al.

(10) Patent No.: US 11,728,796 B2
(45) Date of Patent: Aug. 15, 2023

(54) INVERTED GROUP DELAY CIRCUIT

(71) Applicant: Qorvo US, Inc., Greensboro, NC (US)

(72) Inventors: Nadim Khlat, Cugnaux (FR); Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/363,522

(22) Filed: Jun. 30, 2021

(65) Prior Publication Data

US 2022/0116029 A1    Apr. 14, 2022

Related U.S. Application Data (60) Provisional application No. 63/091,687, filed on Oct. 14, 2020.

(51) Int. Cl.
  *H03K 5/13*    (2014.01)
  *H03K 5/01*    (2006.01)
  (Continued)

(52) U.S. Cl.
  CPC .............. *H03K 5/01* (2013.01); *H03F 1/0233* (2013.01); *H03F 3/45475* (2013.01); *H03F 2200/105* (2013.01); *H03K 2005/00019* (2013.01)

(58) Field of Classification Search
  CPC ............ H03K 5/01; H03K 2005/00019; H03F 1/0233; H03F 3/45475; H03F 2200/105;
  (Continued)

(56) References Cited

U.S. PATENT DOCUMENTS 4,477,848 A * 10/1984 McWhirter ...... G11B 20/00086
4,827,458 A *  5/1989 D'Alayer de Costemore
                             D'Arc ...................... H04R 3/00
                                                        367/136

(Continued)

FOREIGN PATENT DOCUMENTS

EP          3174199 A2    5/2012
WO    2012050257 A2    4/2012

OTHER PUBLICATIONS

Non-Final Office Action for U.S. Appl. No. 14/836,634, dated May 16, 2016, 9 pages.
(Continued)

*Primary Examiner* — Ryan Jager
(74) *Attorney, Agent, or Firm* — Withrow & Terranova, P.L.L.C.

(57) ABSTRACT

An inverted group delay circuit is provided. The inverted group delay circuit can offset a group delay between a pair of signals. In a non-limiting example, the inverted group delay circuit can be configured to offset a group delay (e.g., negative group delay) between a time-variant voltage and a time-variant envelope of an analog signal. More specifically, the inverted group delay circuit can output an inverted time-variant voltage having an opposing phase and time-adjusted relative to the time-variant voltage to thereby offset the group delay between the time-variant voltage and the time-variant envelope. As such, the inverted group delay circuit can be provided in a power management integrated circuit (PMIC) to improve timing alignment between a time-variant voltage(s) and a time-variant analog signal(s) at a power amplifier(s), thus helping to reduce potential amplitude distortion when the analog signal(s) is amplified by the power amplifier(s).

20 Claims, 9 Drawing Sheets

(51) Int. Cl.
*H03F 3/45* (2006.01)
*H03F 1/02* (2006.01)
*H03K 5/00* (2006.01)

(58) Field of Classification Search
CPC . H03F 2203/45544; H03F 2203/45616; H03F 1/0227; H03F 1/34; H03F 3/189
USPC .......................................................... 327/261
See application file for complete search history.

(56) References Cited

U.S. PATENT DOCUMENTS

| | | | |
|---|---|---|---|
| 5,304,864 A | 4/1994 | Hong et al. | |
| 5,510,753 A | 4/1996 | French | |
| 5,838,732 A | 11/1998 | Carney | |
| 6,107,862 A | 8/2000 | Mukainakano et al. | |
| 6,141,377 A | 10/2000 | Sharper et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 7,994,862 B1 | 8/2011 | Pukhovski | |
| 8,461,928 B2 | 6/2013 | Yahav et al. | |
| 8,493,141 B2 | 7/2013 | Khlat et al. | |
| 8,519,788 B2 | 8/2013 | Khlat | |
| 8,588,713 B2 | 11/2013 | Khlat | |
| 8,665,016 B2 | 3/2014 | Chowdhury et al. | |
| 8,718,188 B2 | 5/2014 | Balteanu et al. | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,018,921 B2 | 4/2015 | Gurlahosur | |
| 9,020,451 B2 | 4/2015 | Khlat | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,379,667 B2 | 6/2016 | Khlat et al. | |
| 9,445,371 B2 * | 9/2016 | Khesbak ................... H03F 3/19 | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,748,845 B1 | 8/2017 | Kotikalapoodi | |
| 9,748,912 B2 * | 8/2017 | Choi ........................ H03F 3/19 | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,923,520 B1 | 3/2018 | Abdelfattah et al. | |
| 10,003,416 B1 | 6/2018 | Lloyd | |
| 10,090,808 B1 | 10/2018 | Henzler et al. | |
| 10,097,145 B1 | 10/2018 | Khlat et al. | |
| 10,110,169 B2 | 10/2018 | Khesbak et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,181,826 B2 * | 1/2019 | Khlat ..................... H03F 1/3282 |
| 10,291,181 B2 | 5/2019 | Kim et al. | |
| 10,326,408 B2 | 6/2019 | Khlat et al. | |
| 10,382,071 B2 | 8/2019 | Rozek et al. | |
| 10,476,437 B2 | 11/2019 | Nag et al. | |
| 10,516,368 B2 * | 12/2019 | Balteanu .................. H03F 3/19 |
| 10,530,311 B2 * | 1/2020 | Khlat ..................... H03F 1/301 |
| 10,615,757 B2 * | 4/2020 | Balteanu ............... H03F 1/0238 |
| 10,862,431 B1 | 12/2020 | Khlat | |
| 10,985,703 B2 * | 4/2021 | Balteanu .................. H03F 3/19 |
| 10,985,711 B2 * | 4/2021 | Balteanu ................ H03F 3/245 |
| 11,303,255 B2 * | 4/2022 | Khesbak ................ H03F 3/245 |
| 2002/0167827 A1 | 11/2002 | Umeda et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0240786 A1 | 10/2006 | Liu | |
| 2007/0052474 A1 | 3/2007 | Saito | |
| 2007/0258602 A1 | 11/2007 | Vepsalainen et al. | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2012/0313701 A1 * | 12/2012 | Khlat ..................... H02M 3/07 |
| | | | 330/127 |
| 2013/0021827 A1 | 1/2013 | Ye | |
| 2013/0100991 A1 | 4/2013 | Woo | |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2013/0271221 A1 | 10/2013 | Levesque et al. | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0057684 A1 | 2/2014 | Khlat | |
| 2014/0103995 A1 | 4/2014 | Langer | |
| 2014/0155002 A1 | 6/2014 | Dakshinamurthy et al. | |
| 2014/0184335 A1 * | 7/2014 | Nobbe ..................... H03F 3/195 |
| | | | 330/296 |
| 2014/0199949 A1 | 7/2014 | Nagode et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2014/0361837 A1 | 12/2014 | Strange et al. | |
| 2015/0048883 A1 | 2/2015 | Vinayak | |
| 2015/0071382 A1 | 3/2015 | Wu et al. | |
| 2015/0098523 A1 | 4/2015 | Lim et al. | |
| 2015/0155836 A1 | 6/2015 | Midya et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0050629 A1 * | 2/2016 | Khesbak .................. H03F 3/245 |
| | | | 455/574 |
| 2016/0065137 A1 | 3/2016 | Khlat | |

(56) References Cited

U.S. PATENT DOCUMENTS

| | | | |
|---|---|---|---|
| 2016/0099687 A1* | 4/2016 | Khlat | H03F 3/19 330/75 |
| 2016/0105151 A1 | 4/2016 | Langer | |
| 2016/0118941 A1 | 4/2016 | Wang | |
| 2016/0126900 A1 | 5/2016 | Shute | |
| 2016/0173031 A1 | 6/2016 | Langer | |
| 2016/0181995 A1 | 6/2016 | Nentwig et al. | |
| 2016/0187627 A1 | 6/2016 | Abe | |
| 2016/0197627 A1 | 7/2016 | Qin et al. | |
| 2016/0226448 A1 | 8/2016 | Wimpenny | |
| 2016/0294587 A1 | 10/2016 | Jiang et al. | |
| 2017/0141736 A1 | 5/2017 | Pratt et al. | |
| 2017/0302183 A1 | 10/2017 | Young | |
| 2017/0310398 A1 | 10/2017 | Masuda | |
| 2017/0317913 A1 | 11/2017 | Kim et al. | |
| 2017/0338773 A1 | 11/2017 | Balteanu et al. | |
| 2018/0013465 A1 | 1/2018 | Chiron et al. | |
| 2018/0048265 A1 | 2/2018 | Nentwig | |
| 2018/0048276 A1 | 2/2018 | Khlat et al. | |
| 2018/0076772 A1* | 3/2018 | Khesbak | H03F 1/0261 |
| 2018/0123453 A1 | 5/2018 | Puggelli et al. | |
| 2018/0288697 A1 | 10/2018 | Camuffo et al. | |
| 2018/0302042 A1 | 10/2018 | Zhang et al. | |
| 2018/0309414 A1 | 10/2018 | Khlat et al. | |
| 2018/0367101 A1 | 12/2018 | Chen et al. | |
| 2019/0044480 A1 | 2/2019 | Khlat | |
| 2019/0068234 A1 | 2/2019 | Khlat et al. | |
| 2019/0097277 A1 | 3/2019 | Fukae | |
| 2019/0109566 A1 | 4/2019 | Folkmann et al. | |
| 2019/0109613 A1 | 4/2019 | Khlat et al. | |
| 2019/0222178 A1 | 7/2019 | Khlat et al. | |
| 2019/0238095 A1 | 8/2019 | Khlat | |
| 2019/0267956 A1 | 8/2019 | Granger-Jones et al. | |
| 2019/0222175 A1 | 10/2019 | Khlat et al. | |
| 2020/0007090 A1 | 1/2020 | Khlat et al. | |
| 2020/0036337 A1 | 1/2020 | Khlat | |
| 2020/0106392 A1 | 4/2020 | Khlat et al. | |
| 2020/0136561 A1 | 4/2020 | Khlat et al. | |
| 2020/0136563 A1 | 4/2020 | Khlat | |
| 2020/0136575 A1 | 4/2020 | Khlat et al. | |
| 2020/0144966 A1 | 5/2020 | Khlat | |
| 2020/0153394 A1 | 5/2020 | Khlat et al. | |
| 2020/0177131 A1 | 6/2020 | Khlat | |
| 2020/0204116 A1 | 6/2020 | Khlat | |
| 2020/0228063 A1 | 7/2020 | Khlat | |
| 2020/0259456 A1 | 8/2020 | Khlat | |
| 2020/0259685 A1 | 8/2020 | Khlat | |
| 2020/0266766 A1 | 8/2020 | Khlat et al. | |
| 2020/0321848 A1 | 10/2020 | Khlat | |
| 2020/0328720 A1 | 10/2020 | Khlat | |
| 2020/0336105 A1 | 10/2020 | Khlat | |
| 2020/0336111 A1 | 10/2020 | Khlat | |
| 2020/0350865 A1 | 11/2020 | Khlat | |
| 2020/0382066 A1 | 12/2020 | Khlat | |
| 2021/0036604 A1 | 2/2021 | Khlat et al. | |
| 2021/0184708 A1 | 6/2021 | Khlat | |
| 2021/0194522 A1 | 6/2021 | Stockert et al. | |
| 2021/0226585 A1 | 7/2021 | Khlat | |
| 2021/0234513 A1 | 7/2021 | Khlat | |
| 2021/0265953 A1 | 8/2021 | Khlat | |
| 2022/0052646 A1* | 2/2022 | Khlat | H04L 27/366 |
| 2022/0052647 A1* | 2/2022 | Khlat | H03F 3/245 |
| 2022/0052648 A1* | 2/2022 | Khlat | H03F 1/0227 |
| 2022/0052649 A1* | 2/2022 | Retz | H03F 3/21 |
| 2022/0052650 A1* | 2/2022 | Khlat | H03F 1/0233 |
| 2022/0052651 A1* | 2/2022 | Khlat | H03F 3/195 |
| 2022/0052655 A1* | 2/2022 | Khlat | H03F 3/195 |
| 2022/0116029 A1* | 4/2022 | Khlat | H03F 1/0233 |
| 2022/0165323 A1* | 5/2022 | Zhu | G11C 11/4076 |
| 2022/0166416 A1* | 5/2022 | Zhu | H03K 5/01 |

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.

(56) References Cited

OTHER PUBLICATIONS

Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Quayle Action for U.S. Appl. No. 16/589,940, dated Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Notice of Allowance for U.S. Appl. No. 16/582,471, dated Jun. 22, 2021, 9 pages.
Non-Final Office Action for U.S. Appl. No. 16/597,952, dated May 26, 2021, 7 pages.
Notice of Allowance for U.S. Appl. No. 16/834,049, dated Jun. 24, 2021, 8 pages.
Nakase, et al., "A BiCMOS Wired-OR logic," IEEE Journal of Solid-State Circuits, vol. 30, Issue 6, Jun. 1995, pp. 622-628.
Williams, Arthur, et al.,"Electronic Filter Design Handbook," Third Edition, 1995, McGraw-Hill, Inc. pp. 7.10-7.14.
Non-Final Office Action for U.S. Appl. No. 17/406,550, dated Mar. 13, 2023, 25 pages.

\* cited by examiner

INVERTED GROUP DELAY CIRCUIT

RELATED APPLICATIONS

This application claims the benefit of provisional patent application Ser. No. 63/091,687, filed on Oct. 14, 2020, the disclosure of which is hereby incorporated herein by reference in its entirety.

FIELD OF THE DISCLOSURE

The technology of the disclosure relates generally to a group delay circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant voltage that closely tracks a time-variant power envelope of the RF signal(s). The time-variant voltage is typically generated by a power management circuit in the wireless communication device by first detecting the time-variant power envelop of the RF signal(s) and subsequently mapping the detected time-variant power envelope to a set of target voltage values prestored in a lookup table (LUT). Notably, the inherent processing delay associated with a power management circuit can inadvertently cause the time-variant voltage to lag behind the time-variant power envelope of the RF signal(s). As a result, the peaks of the time-variant voltage may become misaligned with the peaks of the time-variant power envelope, which may cause the power amplifier(s) to clip and distort the RF signal(s). In this regard, it is desirable to ensure that the power management circuit can maintain good alignment between the time-variant voltage and the time-variant power envelope of the RF signal(s).

SUMMARY

Aspects disclosed in the detailed description include an inverted group delay circuit. The inverted group delay circuit can offset a group delay between a pair of signals. In a non-limiting example, the inverted group delay circuit can be configured to offset a group delay (e.g., negative group delay) between a time-variant voltage and a time-variant envelope of an analog signal. More specifically, the inverted group delay circuit can output an inverted time-variant voltage having an opposing phase and time-adjusted relative to the time-variant voltage to thereby offset the group delay between the time-variant voltage and the time-variant envelope. As such, the inverted group delay circuit can be provided in a power management integrated circuit (PMIC) to improve timing alignment between a time-variant voltage(s) and a time-variant analog signal(s) at a power amplifier(s), thus helping to reduce potential amplitude distortion when the analog signal(s) is amplified by the power amplifier(s).

In one aspect, an inverted group delay circuit is provided. The inverted group delay circuit includes a tunable resistor-capacitor (RC) circuit. The tunable RC circuit is configured to output a time-variant voltage having a group delay relative to a time-variant envelope of an analog signal. The inverted group delay circuit also includes an operational amplifier. The operational amplifier includes an inverting terminal coupled to the tunable RC circuit to receive the time-variant voltage. The operational amplifier also includes an output terminal configured to output an inverted time-variant voltage having an opposing phase and time-adjusted relative to the time-variant voltage to thereby offset the group delay.

In another aspect, a PMIC is provided. The PMIC includes a target voltage circuit. The target voltage circuit includes an envelope detector circuit configured to detect a time-variant envelope of an analog signal. The detected time-variant envelope is delayed from the time-variant envelope of the analog signal by a first temporal delay. The target voltage circuit also includes an analog look-up table (LUT) circuit configured to generate a time-variant target voltage based on the detected time-variant envelope of the analog signal. The time-variant target voltage is delayed from the detected time-variant envelope of the analog signal by a second temporal delay. The target voltage circuit also includes an inverted group delay circuit. The inverted group delay circuit includes a tunable RC circuit. The tunable RC circuit is configured to output the time-variant target voltage having a group delay comprising at least the first temporal delay and the second temporal delay. The inverted group delay circuit also includes an operational amplifier. The operational amplifier includes an inverting terminal coupled to the tunable RC circuit to receive the time-variant target voltage. The operational amplifier also includes an output terminal configured to output an inverted time-variant target voltage having an opposing phase and time-adjusted relative to the time-variant target voltage to thereby offset the group delay.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an inverted group delay circuit. The inverted group delay circuit can offset a group delay between a pair of signals. In a non-limiting example, the inverted group delay circuit can be configured to offset a group delay (e.g., negative group delay) between a time-variant voltage and a time-variant envelope of an analog signal. More specifically, the inverted group delay circuit can output an inverted time-variant voltage having an opposing phase and time-adjusted relative to the time-variant voltage to thereby offset the group delay between the time-variant voltage and the time-variant envelope. As such, the inverted group delay circuit can be provided in a power management integrated circuit (PMIC) to improve timing alignment between a time-variant voltage(s) and a time-variant analog signal(s) at a power amplifier(s), thus helping to reduce potential amplitude distortion when the analog signal(s) is amplified by the power amplifier(s).

Figure 1A:
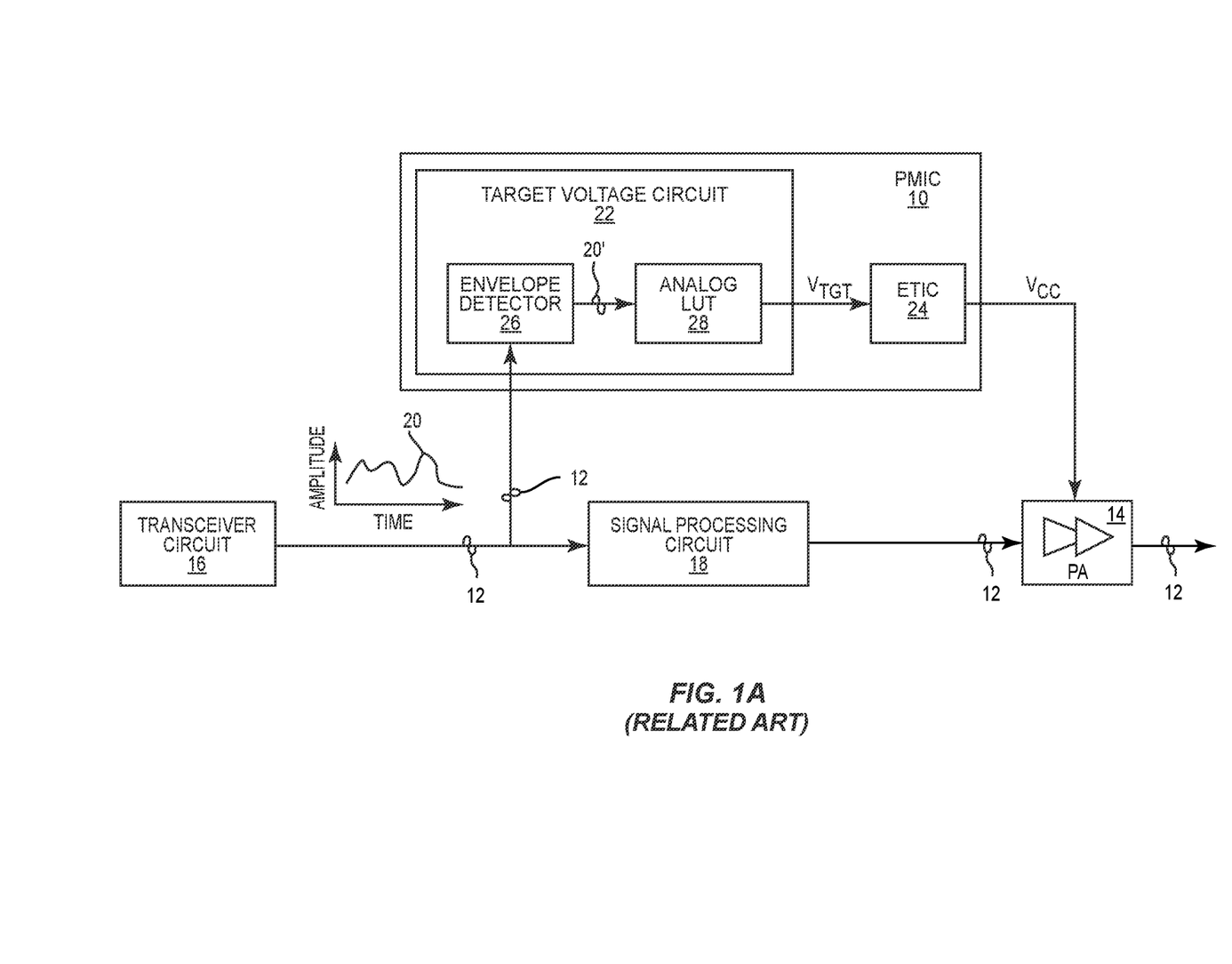
FIG. 1A is a schematic diagram of an exemplary existing power management integrated circuit (PMIC) that may cause amplitude distortion in an analog signal as a result of an inherent processing delay in the existing PMIC.
Figure 1B:
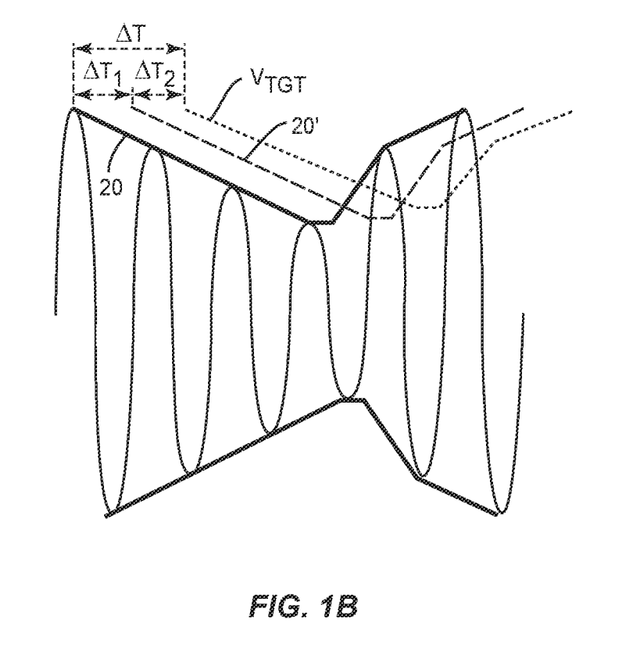
FIG. 1B is a graphic diagram providing an exemplary illustration of a group delay between a time-variant envelope of the analog signal and a target voltage caused by the inherent processing delay in the existing PMIC of FIG. 1A.
Figure 1C:
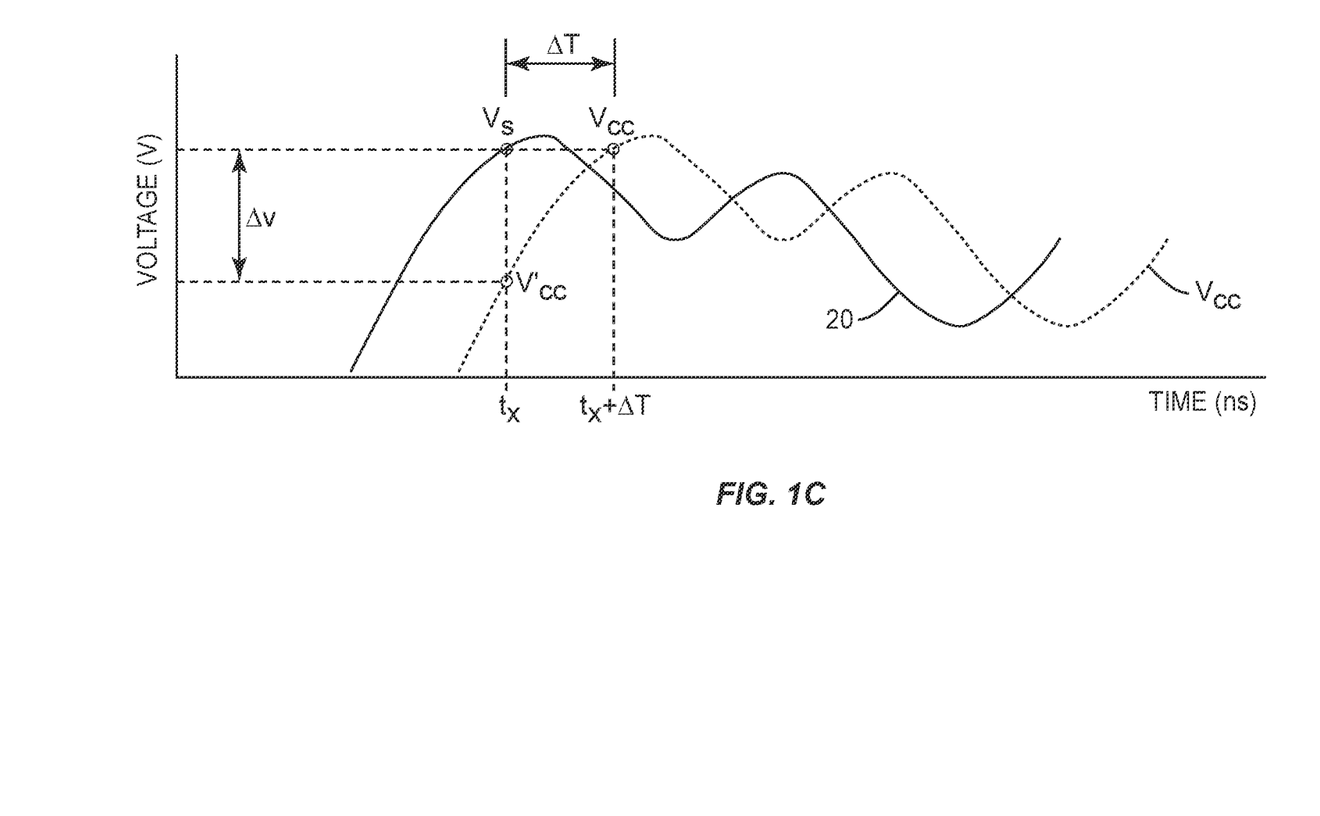
FIG. 1C is a graphic diagram providing an exemplary illustration as to how the inherent processing delay in the existing PMIC of FIG. 1A can cause the amplitude distortion in the analog signal.
Figure 2:
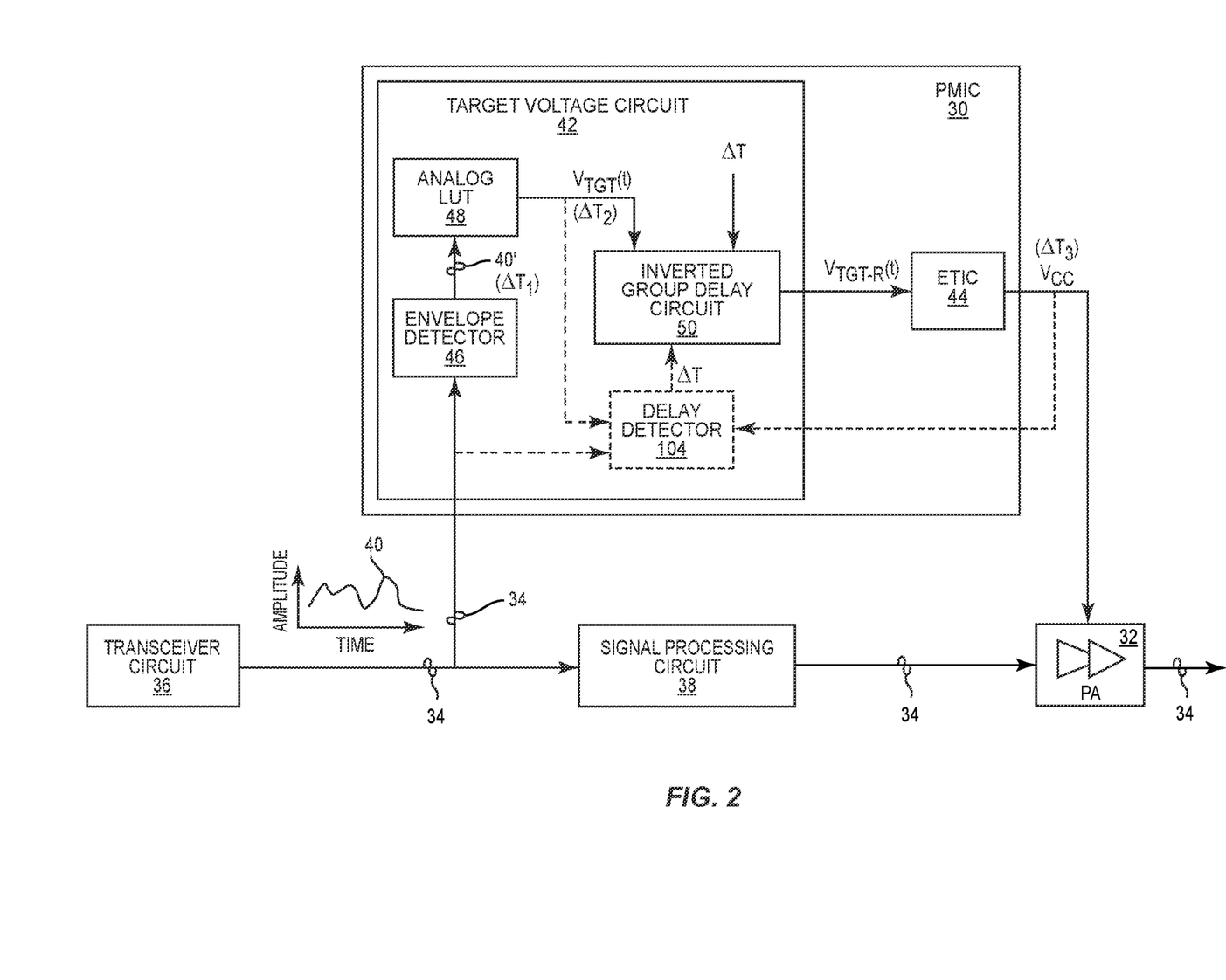
FIG. 2 is a schematic diagram of an exemplary PMIC configured according to embodiments of the present disclosure to offset various group delays incurred in the PMIC.

Before discussing a PMIC employing the inverted group circuit of the present disclosure, starting at FIG. 2, a brief overview of an existing PMIC that may cause amplitude distortion in an analog signal as a result of an inherent processing delay associated with the existing PMIC is first provided with reference to FIGS. 1A-1C.

FIG. 1A is a schematic diagram of an exemplary existing PMIC 10 that that may cause amplitude distortion in an analog signal 12 as a result of an inherent processing delay in the existing PMIC 10. The existing PMIC 10 is configured to provide a time-variant voltage $V_{CC}$ to a power amplifier 14 for amplifying the analog signal 12. The analog signal 12 may be generated by a transceiver circuit 16 and provided to a signal processing circuit 18 in an intermediate frequency (IF). The signal processing circuit 18 may upconvert the analog signal 12 from the IF to a carrier frequency and provide the analog signal 12 to the power amplifier 14 for amplification.

The analog signal 12 is associated with a time-variant envelope 20 that rises and falls over time. Thus, to prevent potential amplitude distortion in the analog signal 12 and ensure higher operating efficiency of the power amplifier 14, it is necessary for the existing PMIC 10 to generate the time-variant voltage $V_{CC}$ to closely track the time-variant envelope 20.

In other words, the time-variant voltage $V_{CC}$ needs to be aligned with the time-variant envelope 20 as closely as possible. As such, the existing PMIC 10 is configured to include a target voltage circuit 22 and an envelope tracking (ET) integrated circuit (ETIC) 24. The target voltage circuit 22 includes an envelope detector circuit 26 and an analog lookup table (LUT) circuit 28. The envelope detector circuit 26 is configured to detect the time-variant envelope 20 of the analog signal 12 and provide a detected time-variant envelope 20' to the analog LUT circuit 28. The analog LUT circuit 28 is configured to generate a target voltage $V_{TGT}$ from the detected time-variant envelope 20' and provide the target voltage $V_{TGT}$ to the ETIC 24. The ETIC 24, in turn, generates the time-variant voltage $V_{CC}$ based on the target voltage $V_{TGT}$.

In this regard, since the target voltage $V_{TGT}$ tracks the detected time-variant envelope 20' and the time-variant voltage $V_{CC}$ tracks the target voltage $V_{TGT}$, the time-variant voltage $V_{CC}$ will end up rising and falling along with the time-variant envelope 20. Notably, the envelope detector circuit 26 and the analog LUT circuit 28 can cause an inherent processing delay. As a result, as shown in FIG. 1B, the detected time-variant envelope 20' will lag behind the time-variant envelope 20 associated with the analog signal 12 and the target voltage $V_{TGT}$ will lag behind the detected time-variant envelope 20'.

FIG. 1B is a graphic diagram providing an exemplary illustration of a group delay $\Delta T$ between the time-variant envelope 20 of the analog signal 12 and the target voltage $V_{TGT}$ caused by the inherent processing delay in the existing PMIC 10 of FIG. 1A. Common elements between FIGS. 1A and 1B are shown therein with common element numbers and will not be re-described herein.

As shown in FIG. 1B, the detected time-variant envelope 20' is delayed from the time-variant envelope 20 of the analog signal 12 by a first temporal delay $\Delta T_1$, and the target voltage $V_{TGT}$ is delayed from the detected time-variant envelope 20' by a second temporal delay $\Delta T_2$. The group delay $\Delta T$, which refers generally to an actual transit time of a signal (e.g., the target voltage $V_{TGT}$ or the time-variant voltage $V_{CC}$) through a device (e.g., the conventional PMIC 10) under test as a function of frequency, can thus include the first temporal delay $\Delta T_1$, the second temporal delay $\Delta T_2$, and/or the inherent processing delay of the ETIC 24. Understandably, the group delay $\Delta T$ can cause timing misalignment between the time-variant voltage $V_{CC}$ and the time-variant envelope 20 at the power amplifier 14.

As illustrated in FIG. 1C, the misalignment between the time-variant voltage $V_{CC}$ and the time-variant envelope 20 of the analog signal 12 can cause amplitude distortion in the analog signal 12. FIG. 1C is a graphic diagram providing an exemplary illustration as to how the inherent processing delay in the existing PMIC 10 of FIG. 1A can cause amplitude distortion in the analog signal 12.

If the time-variant envelope 20 and the time-variant voltage $V_{CC}$ are perfectly aligned, an instantaneous amplitude of the analog signal 12 (not shown), which is represented by a voltage Vs, would substantially equal the time-variant voltage $V_{CC}$ at time $t_x$. However, as shown in FIG. 1C, the time-variant voltage $V_{CC}$ lags behind the time-variant envelope 20 by the group delay $\Delta T$. As such, at time $t_x$, the power amplifier 14 (not shown) receives a lower voltage $V'_{CC}$, instead of the time-variant voltage $V_{CC}$. In this regard, the time-variant voltage $V_{CC}$ deviates from the time-variant envelope 20 by a voltage differential $\Delta v$ at time $t_x$. Consequently, the power amplifier 14 may clip the analog signal 12 to cause an amplitude distortion. As such, it is desirable to reduce the misalignment between the time-variant voltage $V_{CC}$ and the time-variant envelope 20 of the analog signal 12 as much as possible.

In this regard, FIG. 2 is a schematic diagram of an exemplary PMIC 30 configured according to embodiments of the present disclosure to offset various group delays incurred in the PMIC 30.

The PMIC 30 is configured to provide a time-variant voltage $V_{CC}$ to a power amplifier 32 for amplifying an analog signal 34. The analog signal 34 may be generated by a transceiver circuit 36 and provided to a signal processing circuit 38 in the IF. The signal processing circuit 38 may upconvert the analog signal 34 from the IF to a carrier frequency and provide the analog signal 34 to the power amplifier 32 for amplification.

The analog signal 34 is associated with a time-variant envelope 40 that rises and falls over time. Thus, to prevent potential amplitude distortion in the analog signal 34 and ensure higher operating efficiency of the power amplifier 32, it is necessary to generate the time-variant voltage $V_{CC}$ to closely track the time-variant envelope 40.

In this regard, the PMIC 30 is configured to include a target voltage circuit 42. As discussed below, the target voltage circuit 42 is configured to generate an inverted time-variant target voltage $V_{TGT\text{-}R}(t)$ that is time-adjusted relative to the time-variant envelope 40 of the analog signal 34 to offset a group delay(s) incurred in the PMIC 30. Herein, a first signal is said to be time-adjusted relative to a second signal when the first signal is advanced in time to eliminate a negative group delay from the second signal or delayed in time to eliminate a positive group delay from the second signal.

Accordingly, an ETIC 44 in the PMIC 30 can generate a time-variant voltage $V_{CC}$ based on the inverted time-variant target voltage $V_{TGT\text{-}R}(t)$ and provide the time-variant voltage $V_{CC}$ to the power amplifier 32 for amplifying the analog signal 34. Since the inverted time-variant target voltage $V_{TGT\text{-}R}(t)$ is better aligned with the time-variant envelope 40, the time-variant voltage $V_{CC}$ will be better aligned with the time-variant envelope 40 as a result. Therefore, it is possible to reduce or even avoid potential amplitude distortion to the analog signal 34 during amplification.

In a non-limiting example, the target voltage circuit 42 includes an envelope detector circuit 46 and an analog LUT circuit 48. The envelope detector circuit 46 is configured to detect the time-variant envelope 40 of the analog signal 34 and provide a detected time-variant envelope 40' to the analog LUT circuit 48. The analog LUT circuit 48 is configured to generate a target voltage $V_{TGT}(t)$ based on the detected time-variant envelope 40' of the analog signal 34. Like the envelope detector circuit 26 and the analog LUT circuit 28 in the existing PMIC 10 of FIG. 1A, the envelope detector circuit 46 and the analog LUT circuit 48 can each cause certain processing delays. As a result, the detected time-variant envelope 40' may be delayed from the time-variant envelope 40 of the analog signal 34 by a first temporal delay $\Delta T_1$ and the target voltage $V_{TGT}(t)$ may be delayed from the detected time-variant envelope 40' by a second temporal delay $\Delta T_2$. In addition, the ETIC 44 can also incur a certain processing delay that may further delay the time-variant voltage $V_{CC}$ from the target voltage $V_{TGT}(t)$ by a third temporal delay $\Delta T_3$. As a result, the time-variant voltage $V_{CC}$ may become misaligned from the time-variant envelope 40 by the group delay $\Delta T$ that includes the first temporal delay $\Delta T_1$, the second temporal delay $\Delta T_2$, and the third temporal delay $\Delta T_3$.

Figure 3:
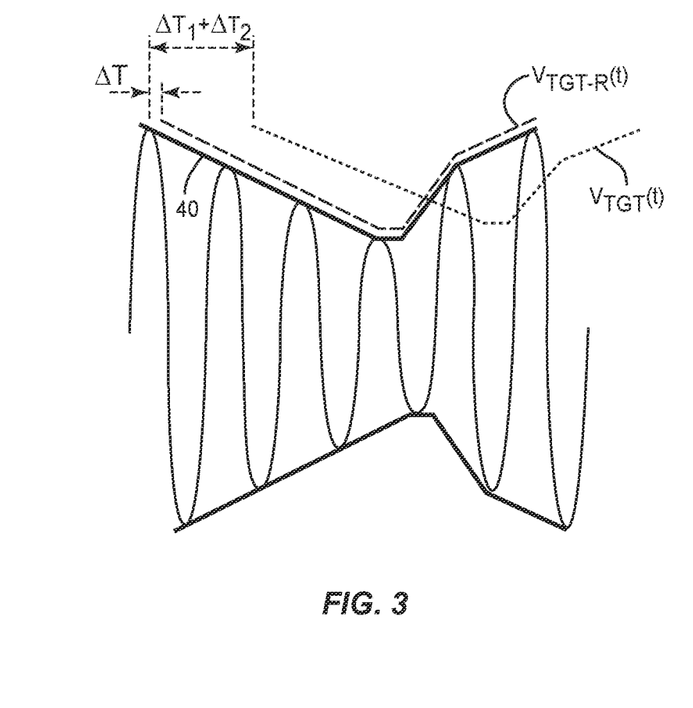
FIG. 3 is a graphic diagram providing an exemplary illustration of an inverted time-variant target voltage that is time-adjusted relative to a time-variant envelope to substantially offset a group delay(s)

In an embodiment, the target voltage circuit 42 is configured to include an inverted group delay circuit 50. As shown in FIG. 3, the inverted group delay circuit 50 is configured to generate the inverted time-variant target voltage $V_{TGT}(t)_{-R}(t)$, which is time-adjusted relative to the time-variant envelope 40 of the analog signal to offset the group delay $\Delta T$ that includes at least the first temporal delay $\Delta T_1$ and the second temporal delay $\Delta T_2$.

FIG. 3 is a graphic diagram providing an exemplary illustration of the inverted time-variant target voltage $V_{TGT-R}(t)$ that is time-adjusted relative to the time-variant envelope 40 to substantially offset the first temporal delay $\Delta T_1$ and the second temporal delay $\Delta T_2$. Common elements between FIGS. 2 and 3 are shown therein with common element numbers and will not be re-described herein.

As shown in FIG. 3, the target voltage $V_{TGT}(t)$ as originally generated by the analog LUT circuit 48 lags behind the time-variant envelope 40 by the group delay $\Delta T$ that includes a sum of the first temporal delay $\Delta T_1$ and the second temporal delay $\Delta T_2$. In contrast, the inverted time-variant target voltage $V_{TGT-R}(t)$ is time-adjusted to substantially offset the first temporal delay $\Delta T_1$ and the second temporal delay $\Delta T_2$ to thereby be better aligned with the time-variant envelope 40. Herein, the inverted time-variant target voltage $V_{TGT-R}(t)$ is said to substantially offset the first temporal delay $\Delta T_1$ and the second temporal delay $\Delta T_2$ when a temporal gap $\Delta T$ between the inverted time-variant target voltage $V_{TGT-R}(t)$ and the time-variant envelope 40 is less than 10% of the group delay $\Delta T$. As a result of improved alignment with the time-variant envelope 40, it is possible to reduce or even avoid amplitude distortion at the power amplifier 32.

Figure 4A:
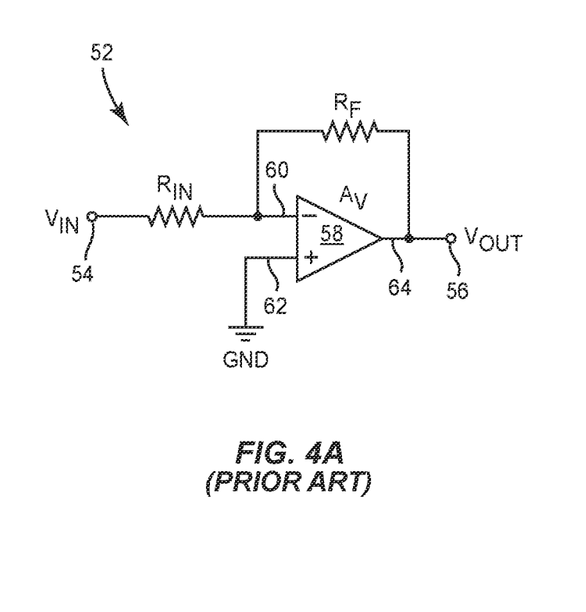
FIG. 4A is a schematic diagram of a conventional inverted amplifier circuit.
Figure 4B:
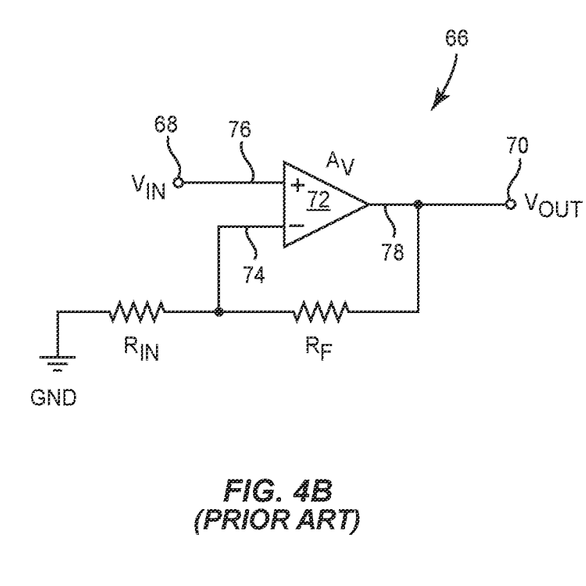
FIG. 4B is a schematic diagram of a conventional non-inverted amplifier circuit.
Figure 5:
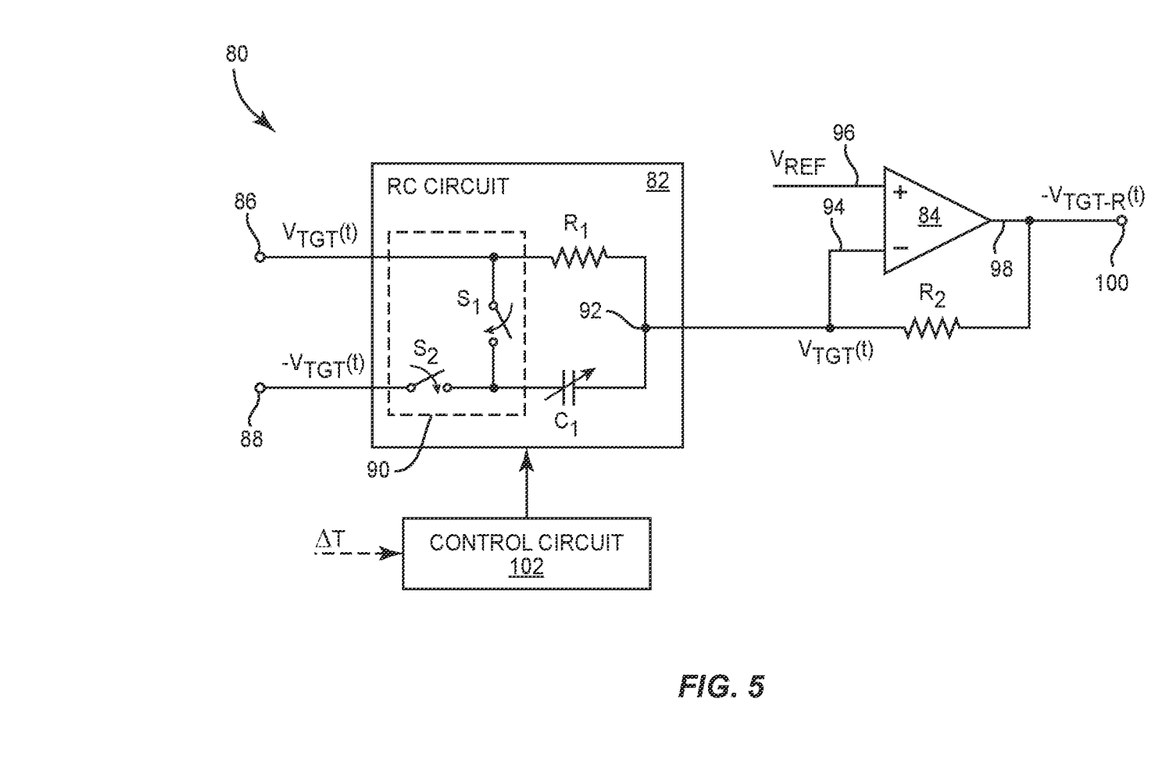
FIG. 5 is a schematic diagram of an exemplary inverted group delay circuit configured according to an embodiment of the present disclosure.

Before discussing the inverted group delay circuit 50 of the present disclosure, starting at FIG. 5, a brief overview of inverted and non-inverted amplifiers is first provided with reference to FIGS. 4A and 4B, respectively.

FIG. 4A is a schematic diagram of a conventional inverted amplifier circuit 52. The conventional inverted amplifier circuit 52 receives an input voltage $V_{IN}$ via a voltage input 54 and outputs an inverted output voltage $V_{OUT}$ via a voltage output 56. The conventional inverted amplifier circuit 52 also includes an operational amplifier 58, which includes an inverting terminal 60, a non-inverting terminal 62, and an output terminal 64. The inverting terminal 60 is coupled to the voltage input 54 via an input resistor $R_{IN}$ to receive the input voltage $V_{IN}$. The non-inverting terminal 62 is coupled to a ground (GND). The output terminal 64 is coupled to the voltage output 56. The conventional inverted amplifier circuit 52 also includes a feedback resistor RF that is coupled between the inverting terminal 60 and the output terminal 64.

The conventional inverted amplifier circuit 52 is configured to output the inverted output voltage $V_{OUT}$ that is 180° out of phase from the input voltage $V_{IN}$. The conventional inverted amplifier circuit 52 generates a voltage gain $A_V$ as shown in equation (Eq. 1) below.

$$A_V = V_{OUT}/V_{IN} = -R_F/R_{IN} \qquad \text{(Eq. 1)}$$

FIG. 4B is a schematic diagram of a conventional non-inverted amplifier circuit 66. The conventional non-inverted amplifier circuit 66 receives an input voltage $V_{IN}$ via a voltage input 68 and outputs a non-inverted output voltage $V_{OUT}$ via a voltage output 70. The conventional non-inverted amplifier circuit 66 also includes an operational amplifier 72, which includes an inverting terminal 74, a non-inverting terminal 76, and an output terminal 78. The non-inverting terminal 76 is coupled to the voltage input 68 to receive the input voltage $V_{IN}$. The inverting terminal 74 is coupled to the GND via an input resistor $R_{IN}$. The output terminal 78 is coupled to the voltage output 56. The conventional non-inverted amplifier circuit 66 also includes a feedback resistor $R_F$ that is coupled between the inverting terminal 74 and the output terminal 78.

The conventional non-inverted amplifier circuit 66 is configured to output the inverted output voltage $V_{OUT}$ that is in phase with the input voltage $V_{IN}$. The conventional non-inverted amplifier circuit 66 generates a voltage gain $A_V$ as shown in equation (Eq. 2) below.

$$A_V = V_{OUT}/V_{IN} = (1 + R_F/R_{IN}) \qquad \text{(Eq. 2)}$$

FIG. 5 is a schematic diagram of an exemplary inverted group delay circuit 80 configured according to an embodiment of the present disclosure and can be provided in the PMIC 30 of FIG. 2 as the inverted group delay circuit 50. Common elements between FIGS. 2 and 5 are shown therein with common element numbers and will not be re-described herein.

In a specific embodiment disclosed herein, the inverted group delay circuit 80 is configured to offset the group delay $\Delta T$ between the time-variant target voltage $V_{TGT}(t)$ or the time-variant voltage $V_{CC}(t)$ and the time-variant envelope 40 of the analog signal 34. However, it should be appreciated that the inverted group delay circuit 80 can be configured flexibly and utilized broadly to correct a positive group delay $\Delta T$ and/or a negative group delay $-\Delta T$ between any pair of signals.

In a non-limiting example, the inverted group delay circuit 80 includes a tunable resistor-capacitor (RC) circuit 82 and an operational amplifier 84. The tunable RC circuit 82 includes a first voltage input 86 and a second voltage input 88 each coupled to a switch circuit 90. The tunable RC circuit 82 also includes a resistor $R_1$ and a tunable capacitor $C_1$ that are coupled in parallel between a common node 92 and the switch circuit 90. For example, the switch circuit 90 includes a first switch $S_1$ and a second switch $S_2$. The first switch $S_1$ is coupled between the first voltage input 86 and the second voltage input 88. The second switch $S_2$ is coupled between the second voltage input 88 and the tunable capacitor $C_1$. Although the inverted group delay circuit 80 is shown to include the tunable capacitor $C_1$, it should be appreciated that the tunable capacitor $C_1$ can be replaced by a tunable resistor.

In examples discussed herein, the tunable RC circuit 82 is configured to output a time-variant voltage $V_{TGT}(t)$, which is equivalent to and referred interchangeably as the time-variant target voltage $V_{TGT}(t)$ in FIG. 2. In this regard, according to the previous discussion in FIG. 2, the time-variant target voltage $V_{TGT}(t)$ is delayed from the time-variant envelope 40 of the analog signal 34 by the group delay $\Delta T$.

The operational amplifier 84 includes an inverting terminal 94, a non-inverting terminal 96, and an output terminal 98. The output terminal 98 is coupled to the inverting terminal 94 via a feedback resistor $R_2$.

The inverting terminal 94 is coupled to the common node 92 to receive the time-variant target voltage $V_{TGT}(t)$. The non-inverting terminal 96 is configured to receive a reference voltage $V_{REF}$ so determined to keep the operational amplifier 84 operating in a respective linear region. In a non-limiting example, the reference voltage $V_{REF}$ can be set to 0 V. The output terminal 98 is coupled to a voltage output 100 and configured to output an inverted time-variant voltage $-V_{TGT-R}(t)$, which is equivalent to and referred interchangeably as the inverted time-variant target voltage $V_{TGT-R}(t)$ in FIG. 2. The inverted time-variant target voltage $-V_{TGT-R}(t)$ is so generated to have an opposing phase (180° phase offset) and be time-adjusted relative to the time-variant target voltage $V_{TGT}(t)$ to thereby offset the group delay $\Delta T$, which can be a positive group delay $\Delta T$ or a negative group delay $-\Delta T$.

In a non-limiting example, the inverted group delay circuit 80 further includes a control circuit 102, which can be a field-programmable gate array (FPGA), as an example. The control circuit 102 can be configured to determine the group delay $\Delta T$ between the time-variant target voltage $V_{TGT}(t)$ and the time-variant envelope 40 of the analog signal 34. In a non-limiting example, the group delay $\Delta T$ can be predetermined (e.g., during fabrication and/or calibration) and stored in the control circuit 102. Accordingly, the control circuit 102 can control the tunable RC circuit 82 to output the time-variant target voltage $V_{TGT}(t)$ with the group delay $\Delta T$.

In one embodiment, the inverted group delay circuit 80 can be configured to output the inverted time-variant target voltage $V_{TGT-R}(t)$ that is time-adjusted to offset a negative group delay $-\Delta T$. In this regard, the tunable RC circuit 82 can be configured to receive a positive time-variant target voltage $V_{TGT}(t)$ via the first voltage input 86. The control circuit 102 may close the first switch $S_1$ to couple the first voltage input 86 to the resistor $R_1$ and the tunable capacitor $C_1$, while concurrently opening the second switch $S_2$ to decouple the second voltage input 88 from the resistor $R_1$ and the tunable capacitor $C_1$.

Figure 6A:
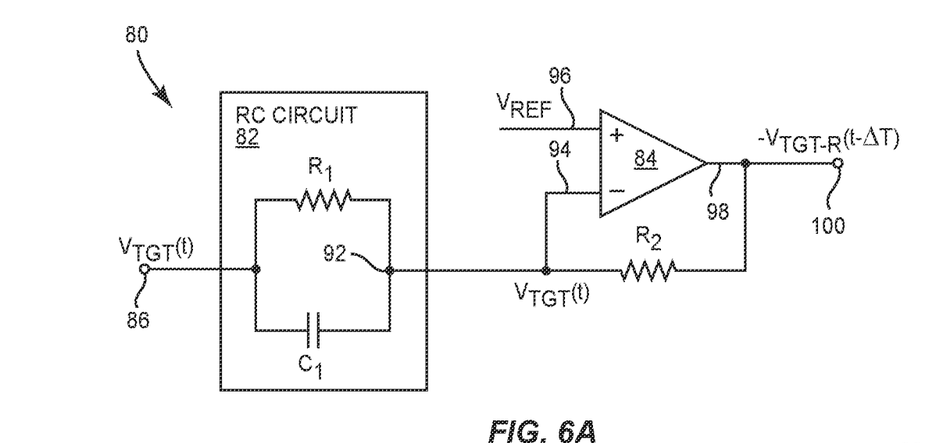
FIG. 6A is a schematic diagram providing an exemplary illustration of the inverted group delay circuit of FIG. 5 operable to offset a negative group delay.

FIG. 6A is a schematic diagram providing an exemplary illustration of the inverted group delay circuit 80 of FIG. 5 operable to offset the negative group delay $-\Delta T$. Common elements between FIGS. 5 and 6A are shown therein with common element numbers and will not be re-described herein.

In a non-limiting example, the inverted group delay circuit 80 operable according to FIG. 6A can implement a transfer function H(s) as expressed in equation (Eq. 3) below.

$$H(s) = -(R_2/R_1)*(1+R_1*C_1*s) \qquad (Eq. 3)$$

In the equation (Eq. 3) above, s represents a Laplace notation that defines a frequency characteristic of a filter or a network. Notably, the negative group delay $-\Delta T$ is a function of the RC constant $\tau$ ($\tau = R_1C_1$) of the tunable RC circuit 82. In this regard, the control circuit 102 may control the tunable capacitor $C_1$ to flexibly adjust the negative group delay $-\Delta T$. Thus, in accordance with the transfer function H(s) above, the inverted group delay circuit 80 can generate the inverted time-variant target voltage $-V_{TGT-R}(\tau-\Delta T)$ that is time-advanced to offset the negative group delay $-\Delta T$.

In another embodiment, the inverted group delay circuit 80 can be configured to output the inverted time-variant target voltage $V_{TGT-R}(t)$ that is time-adjusted to offset a positive group delay $\Delta T$. In this regard, the tunable RC circuit 82 can be configured to receive a positive time-variant target voltage $V_{TGT}(t)$ via the first voltage input 86 and a negative time-variant target voltage $-V_{TGT}(t)$ via the second voltage input 88. The control circuit 102 may open the first switch $S_1$ to decouple the first voltage input 86 from the tunable capacitor $C_1$, while concurrently closing the second switch $S_2$ to couple the second voltage input 88 to the tunable capacitor $C_1$.

Figure 6B:
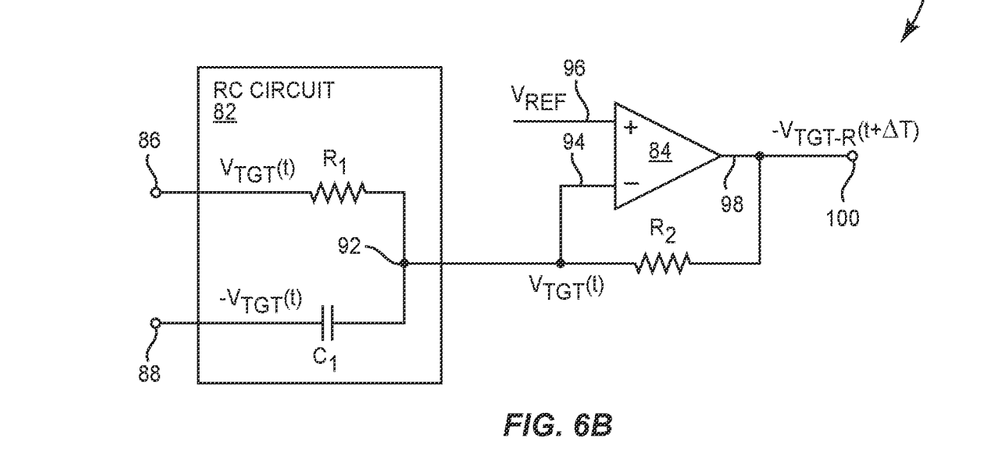
FIG. 6B is a schematic diagram providing an exemplary illustration of the inverted group delay circuit of FIG. 5 operable to offset a positive group delay.

FIG. 6B is a schematic diagram providing an exemplary illustration of the inverted group delay circuit 80 of FIG. 5 operable to offset the positive group delay $\Delta T$. Common elements between FIGS. 5 and 6B are shown therein with common element numbers and will not be re-described herein.

In a non-limiting example, the inverted group delay circuit 80 operable according to FIG. 6B can implement a transfer function H(s) as expressed in equation (Eq. 4) below.

$$H(s) = -(R_2/R_1)*(1-R_1*C_1*s) \qquad (Eq. 4)$$

Notably, the positive group delay $\Delta T$ is a function of the RC constant $\tau$ ($\tau = R_1C_1$) of the tunable RC circuit 82. In this regard, the control circuit 102 may control the tunable capacitor $C_1$ to flexibly adjust the positive group delay $\Delta T$. Thus, in accordance with the transfer function H(s) above, the inverted group delay circuit 80 can generate the inverted time-variant target voltage $-V_{TGT-R}(\tau+\Delta T)$ that is time-delayed to offset the positive group delay $\Delta T$.

With reference back to FIG. 2, alternative to predetermining and storing the group delay d $\Delta T$ in the control circuit 102, the target voltage circuit 42 may be configured to include a delay detector circuit 104 to dynamically determine the group delay $\Delta T$. In one non-limiting example, the delay detector circuit 104 can detect the group delay $\Delta T$ that includes the first temporal delay $\Delta T_1$ and the second temporal delay $\Delta T_2$. In another non-limiting example, the delay detector circuit 104 can detect the group delay $\Delta T$ that includes the first temporal delay $\Delta T_1$, the second temporal delay $\Delta T_2$, and the third temporal delay $\Delta T_3$. Accordingly, the delay detector circuit 104 provides the determined group delay $\Delta T$ to the inverted group delay circuit 50.

Figure 7:
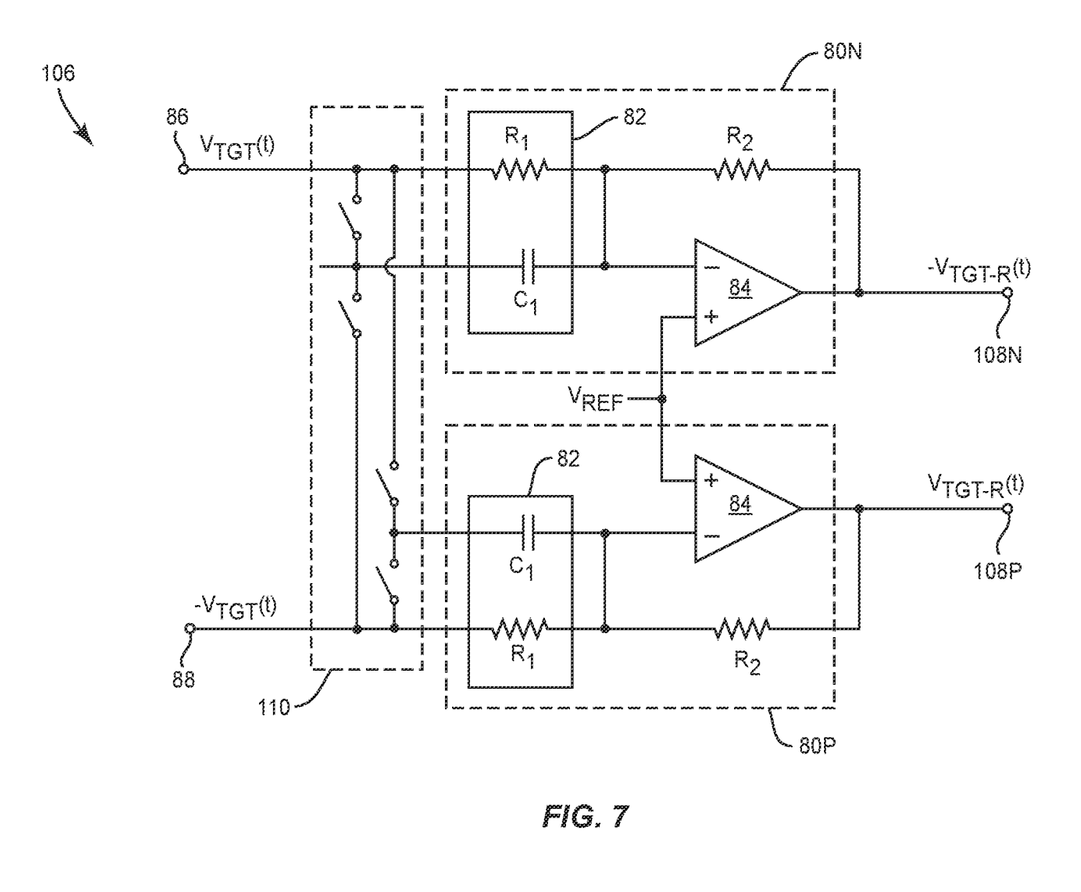
FIG. 7 is a schematic diagram providing an exemplary differential inverted group delay circuit.

In a non-limiting example, it is possible to employ a pair of the inverted group delay circuit 80 in FIG. 5 to form a differential inverted group delay circuit. In this regard, FIG. 7 is a schematic diagram of an exemplary differential inverted group delay circuit 106 that includes a pair of the inverted group delay circuit 80 of FIG. 5. Common elements between FIGS. 5 and 7 are shown therein with common element numbers and will not be re-described herein.

The differential inverted grope delay circuit 106 includes a positive inverted group delay circuit 80P and a negative inverted group delay circuit 80N. In this regard, the differential inverted group delay circuit 106 can be employed to offset the group delay $\Delta T$ when the power amplifier 32 is a differential power amplifier.

Each of the positive inverted group delay circuit 80P and the negative inverted group delay circuit 80N is the same as the inverted group delay circuit 80 of FIG. 5, which includes the tunable RC circuit 82 and the operational amplifier 84. The positive inverted group delay circuit 80P is configured to output a positive inverted time-variant voltage $V_{TGT-R}(\tau)$ at a positive voltage output 108P. The negative inverted group delay circuit 80N is configured to output a negative inverted time-variant voltage $-V_{TGT-R}(\tau)$ at a negative voltage output 108N. In a non-limiting example, the tunable RC circuit 82 in each of the positive inverted group delay circuit 80P and the negative inverted group delay circuit 80N is coupled to the first voltage input 86 and the second voltage input 88 via a switch circuit 110.

Those skilled in the art will recognize improvements and modifications to the embodiments of the present disclosure. All such improvements and modifications are considered within the scope of the concepts disclosed herein and the claims that follow.

What is claimed is:

1. An inverted group delay circuit comprising:
   a tunable resistor-capacitor (RC) circuit configured to output a time-variant voltage having a group delay relative to a time-variant envelope of an analog signal; and
   an operational amplifier comprising:
      an inverting terminal coupled to the tunable RC circuit to receive the time-variant voltage; and
      an output terminal configured to output an inverted time-variant voltage having an opposing phase and time-adjusted to have one of a positive group delay and a negative group delay relative to the time-variant voltage to thereby offset the group delay, wherein each of the positive group delay and the negative group delay is a function of an RC constant of the tunable RC circuit.

2. The inverted group delay circuit of claim 1, wherein the operational amplifier further comprises:
   a non-inverting terminal configured to receive a reference voltage; and
   a feedback resistor coupled between the output terminal and the inverting terminal.

3. The inverted group delay circuit of claim 2, wherein the tunable RC circuit comprises:
   a first voltage input and a second voltage input coupled to a switch circuit; and
   a resistor and a tunable capacitor coupled in parallel between the inverting terminal and the switch circuit.

4. The inverted group delay circuit of claim 3, further comprising a control circuit configured to:
   determine the group delay between the time-variant voltage and the time-variant envelope of the analog signal; and
   control the tunable capacitor to adjust the RC constant to thereby cause the tunable RC circuit to output the time-variant voltage with the determined group delay.

5. The inverted group delay circuit of claim 4, wherein:
   the tunable RC circuit is configured to receive a positive time-variant voltage via the first voltage input; and
   the control circuit is further configured to:
      control the switch circuit to cause the first voltage input to be coupled to the resistor and the tunable capacitor; and
      control the switch circuit to cause the second voltage input to be decoupled from the resistor and the tunable capacitor.

6. The inverted group delay circuit of claim 5, wherein:
   the group delay between the time-variant voltage and the time-variant envelope comprises the negative group delay; and
   the inverted group delay circuit has a transfer function expressed as $H(s)=-(R_2/R_1)*(1+R_1*C_1*s)$.

7. The inverted group delay circuit of claim 4, wherein:
   the tunable RC circuit is configured to receive a positive time-variant voltage via the first voltage input and a negative time-variant voltage via the second voltage input; and
   the control circuit is further configured to:
      control the switch circuit to cause the first voltage input to be coupled to the resistor and decoupled from the tunable capacitor; and
      control the switch circuit to cause the second voltage input to be coupled to the tunable capacitor and decoupled from the resistor.

8. The inverted group delay circuit of claim 7, wherein:
   the group delay between the time-variant voltage and the time-variant envelope comprises the positive group delay; and
   the inverted group delay circuit has a transfer function expressed as $H(s)=-(R_2/R_1)*(1-R_1*C_1*s)$.

9. A power management integrated circuit (PMIC) comprising:
   a target voltage circuit comprising:
      an envelope detector circuit configured to detect a time-variant envelope of an analog signal, wherein the detected time-variant envelope is delayed from the time-variant envelope of the analog signal by a first temporal delay;
      an analog look-up table (LUT) circuit configured to generate a time-variant target voltage based on the detected time-variant envelope of the analog signal, wherein the time-variant target voltage is delayed from the detected time-variant envelope of the analog signal by a second temporal delay; and
   an inverted group delay circuit comprising:
      a tunable resistor-capacitor (RC) circuit configured to output the time-variant target voltage having a group delay comprising at least the first temporal delay and the second temporal delay; and
      an operational amplifier comprising:
         an inverting terminal coupled to the tunable RC circuit to receive the time-variant target voltage; and
         an output terminal configured to output an inverted time-variant target voltage having an opposing phase and time-adjusted relative to the time-variant target voltage to thereby offset the group delay.

10. The PMIC of claim 9, wherein:
    the operational amplifier further comprises:
       a non-inverting terminal configured to receive a reference voltage; and
       a feedback resistor coupled between the output terminal and the inverting terminal; and
    the tunable RC circuit comprises:
       a first voltage input and a second voltage input coupled to a switch circuit; and
       a resistor and a tunable capacitor coupled in parallel between the inverting terminal and the switch circuit.

11. The PMIC of claim 10, wherein the inverted group delay circuit further comprises a control circuit configured to:
    determine the group delay between the time-variant target voltage and the time-variant envelope; and
    control the tunable capacitor to thereby cause the tunable RC circuit to output the time-variant target voltage with the determined group delay.

12. The PMIC of claim 11, wherein:
    the tunable RC circuit is configured to receive a positive time-variant target voltage via the first voltage input; and
    the control circuit is further configured to:
       control the switch circuit to cause the first voltage input to be coupled to the resistor and the tunable capacitor; and control the switch circuit to cause the second voltage input to be decoupled from the resistor and the tunable capacitor.

13. The PMIC of claim 12, wherein:
the group delay between the time-variant target voltage and the time-variant envelope corresponds to a negative group delay; and
the inverted group delay circuit has a transfer function expressed as $H(s)=-(R_2/R_1)*(1+R_1*C_1*s)$.

14. The PMIC of claim 11, wherein:
the tunable RC circuit is configured to receive a positive time-variant target voltage via the first voltage input and a negative time-variant target voltage via the second voltage input; and
the control circuit is further configured to:
control the switch circuit to cause the first voltage input to be coupled to the resistor and decoupled from the tunable capacitor; and
control the switch circuit to cause the second voltage input to be coupled to the tunable capacitor and decoupled from the resistor.

15. The PMIC of claim 14, wherein:
the group delay between the time-variant target voltage and the time-variant envelope corresponds to a positive group delay; and
the inverted group delay circuit has a transfer function expressed as $H(s)=-(R_2/R_1)*(1-R_1*C_1*s)$.

16. The PMIC of claim 9 wherein the first temporal delay and the second temporal delay are predetermined and stored in the inverted group delay circuit.

17. The PMIC of claim 9 wherein the target voltage circuit further comprises a delay detector circuit configured to:
dynamically determine the first temporal delay and the second temporal delay; and
provide the determined first temporal delay and the determined second temporal delay to the inverted group delay circuit.

18. The PMIC of claim 9 further comprising an envelope tracking integrated circuit (ETIC) configured to generate a time-variant voltage for amplifying the analog signal, wherein the time-variant voltage is delayed from the time-variant target voltage by a third temporal delay.

19. The PMIC of claim 18 wherein the inverted group delay circuit is further configured to generate the inverted time-variant target voltage that is time-adjusted to offset the group delay further comprising the third temporal delay.

20. A differential inverted group delay circuit comprising:
a positive inverted group delay circuit configured to output a positive inverted time-variant voltage via a positive voltage output; and
a negative inverted group delay circuit configured to output a negative inverted time-variant voltage via a negative voltage output;
wherein each of the positive inverted group delay circuit and the negative inverted group delay circuit comprises:
a tunable resistor-capacitor (RC) circuit configured to output a time-variant voltage having a group delay relative to a time-variant envelope of an analog signal; and
an operational amplifier comprising:
an inverting terminal coupled to the tunable RC circuit to receive the time-variant voltage; and
an output terminal configured to output a respective one of the positive inverted time-variant voltage and the negative inverted time-variant voltage having an opposing phase and time-adjusted relative to the time-variant voltage to thereby offset the group delay.

* * * * *